United States Patent [19]

Kawamura et al.

[11] Patent Number: 5,939,231
[45] Date of Patent: Aug. 17, 1999

[54] IMAGE FORMING MATERIAL AND IMAGE FORMING METHOD EMPLOYING THE SAME

[75] Inventors: Tomonori Kawamura; Masataka Takimoto, both of Hino, Japan

[73] Assignee: Konica Corporation, Tokyo, Japan

[21] Appl. No.: 08/902,241

[22] Filed: Jul. 29, 1997

[30] Foreign Application Priority Data

Aug. 9, 1996 [JP] Japan .................................. 8-211081

[51] Int. Cl.$^6$ ........................................................ G03F 7/34
[52] U.S. Cl. ........................ 430/201; 430/200; 430/207; 430/253
[58] Field of Search ................................ 430/200, 201, 430/207, 253

[56] References Cited

U.S. PATENT DOCUMENTS 5,691,103  11/1997  Takeyama et al. ...................... 430/200
5,693,447  12/1997  Takeyama et al. ...................... 430/200
5,716,710   2/1998  Kapusniak et al. ..................... 430/200

*Primary Examiner*—Richard L. Schilling
*Attorney, Agent, or Firm*—Frishauf, Holtz, Goodman, Langer & Chick, P.C.

[57] ABSTRACT

An image forming material is disclosed which comprises an image receiving sheet having been laminated on an imaging sheet, the imaging sheet comprising a support and provided thereon, an image forming layer contacting the image receiving sheet, an image being formed by exposing the material to a high density energy light to reduce adhesion between the image forming layer and the support at exposed portions without substantially changing adhesion between the image forming layer and the image receiving sheet and then peeling the image receiving sheet from the image forming layer to transfer the image forming layer at exposed portions to the image receiving sheet, wherein both surfaces of the image receiving sheet before the lamination have an average surface roughness Ra of 0.05 to 0.4 μm.

10 Claims, 1 Drawing Sheet

IMAGE FORMING MATERIAL AND IMAGE FORMING METHOD EMPLOYING THE SAME

FIELD OF THE INVENTION

The present invention relates to an image forming material with high resolution which minimizes transporting failure in an image forming apparatus, and an image forming method using the same.

BACKGROUND OF THE INVENTION

The recording method is well known which comprises the steps of exposing to a high density energy light such as a laser light, an image forming material, whereby a part of the material is deformed, released, burnt or evaporated and removed. This method is a dry process in which a processing solution containing a chemical is not employed, and only the exposed portions are melt-deformed, released or evaporated, which has an advantage resulting in high contrast. This method is used for an optical recording material such as a resist material, an optical disc or an image forming material obtaining a visual image. This image forming method hereinafter is defined as an image forming method according to abrasion.

Japanese Patent O.P.I. Publication Nos. 59-5447, 59-10563, and 62-115153 disclose a method in which a binder resin is photo-degraded by a pattern exposure to form a resist, Japanese Patent O.P.I. Publication Nos. 55-132536, 57-27788, and 57-103137 disclose a method in which a thin inorganic compound layer provided by evaporation-deposit is exposed to record information by melt-deformation, Japanese Patent O.P.I. Publication Nos. 64-56591, 1-99887, and 6-40163 disclose a method in which a colored binder resin is removed by light heat conversion to record information, and U.S. Pat. No. 4,245,003 discloses an image forming material comprising an image forming layer containing graphite or carbon black.

In Japanese Patent O.P.I. Publication No. 60-25549 is disclosed a method of bringing a laser recording film into contact with a transfer-receiving material and then exposing the resulting material to light. This method processes the recording film and the receiving material separately, and the image forming apparatus requires complex means for transporting the above two sheets and superposing one sheet onto the other, resulting in problems that the apparatus is large-sized and increased in its manufacturing cost.

In Japanese Patent O.P.I. Publication No. 4-327982 is disclosed an image forming method comprising the steps of (a) exposing an image forming material having an adhesive tape on an imaging sheet, and (b) then peeling the adhesive tape (image receiving sheet) from the imaging sheet to form an image. This method processes one sheet and can provide a compact and simplified image forming apparatus. However, there is a problem in transportability in the apparatus of the image forming material, in which an imaging sheet is integrated with an image receiving material, or in transportability in the apparatus of the exposed, separated imaging sheet and image receiving sheet.

SUMMARY OF THE INVENTION

An object of the invention is to provide an image forming material having an excellent transportability in an image forming apparatus, in which an imaging sheet is integrated with an image receiving material, and an image forming method employing the same.

DETAILED DESCRIPTION OF THE INVENTION

Figure 1:
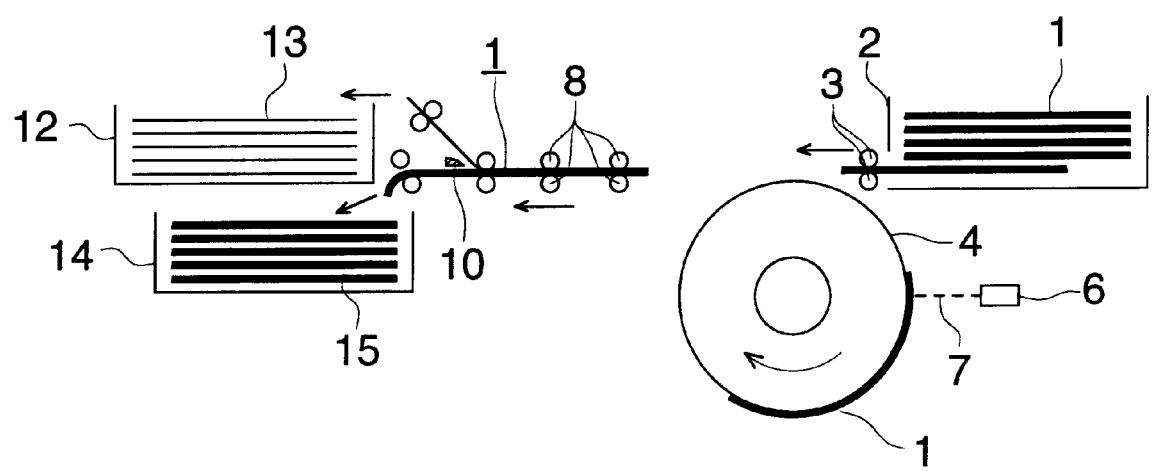
FIG. 1 is a process forming an image using the image forming material according to the present invention.

The above object of the invention can be attained by the followings:

1. an image forming material comprising an imaging sheet and an image receiving sheet, the imaging sheet comprising a support and provided thereon, an image forming layer contacting the image receiving sheet, an image being formed by exposing the material to a high density energy light to reduce adhesion between the image forming layer and the support at exposed portions without substantially changing adhesion between the image forming layer and the image receiving sheet and then peeling the image receiving sheet from the image forming layer to transfer the image forming layer at exposed portions to the image receiving sheet, wherein the image receiving sheet comprises a substrate, and both surfaces of the image receiving sheet have a surface roughness Ra of 0.05 to 0.4 $\mu$m, 2. the image forming material of item 1 above, wherein the surface on the side of the support opposite the image forming layer and the surface of the image receiving sheet have a smooster value of 5 to 100 mmHg in an atmosphere of 23° C. and 55% RH, 3. the image forming material of item 1 or 2 above, wherein the image receiving sheet has an anti-static layer, or 4. a method of forming an image, the method comprising the steps of exposing the image forming material of item 1, 2 or 3 to a high density energy light from the support side, whereby adhesion between the image forming layer and the support at exposed portions is reduced without substantially changing adhesion between the image forming layer and the image receiving sheet and then peeling the image receiving sheet from the image forming sheet to transfer the image forming layer at exposed portions to the image receiving sheet.

The invention will be explained in detail below.

(Image Forming Material)

The image forming material in the invention comprises an image receiving sheet having been laminated on an imaging sheet as a basic constitution. The imaging sheet comprises a support and provided thereon, an image forming layer contacting the image receiving sheet.

<Support>

The support includes a resin film such as polyacrylate, polymethacrylate, polyethyleneterephthalate, polybutyleneterephthalate, polyethylenenaphthalate, polycarbonate, polyvinyl chloride, polyethylene, polypropylene, polystyrene, nylon, aromatic polyamide, polyether etherketone, polysulfone, polyether sulfone, polyimide or polyether imide, or a film in which the above two or more resin films are laminated.

The support used in the invention is a support having a transparency of 50% or more to light of a light source, and is preferably a support obtained by orienting resins in the film form and heat-setting in view of dimensional stability. The support may contain a filler such as titanium oxide, zinc oxide, barium sulfate or calcium carbonate, a colorant or an anti-static agent as long as it does not inhibit the effects of the invention. The thickness of the support in the invention is preferably 10 to 500 $\mu$m, and more preferably 25 to 250 $\mu$m.

The image forming layer is composed of a colorant and a binder carrying the colorant as a basic constitution.

The colorant used in the invention includes a colorant absorbing a light emitted from a light source and is preferably carbon black, since it absorbs light of a wide range wavelength, which includes ultraviolet, visible and infrared light.

In addition to this, inorganic or organic pigments or dyes are used, which are comprised of monochromatic pigment or a mixture of two or three kinds pigments. The inorganic pigment includes titanium dioxide, carbon black, zinc oxide, Prussian blue, cadmium sulfide, iron oxide, and chromates of lead, zinc, barium or calcium. The organic pigment includes azo, thioindigo, anthraquinone, anthanthraquinone or triphenedioxazine pigments, but dye pigment, phthalocyanine pigment (copper phthalocyanine or its derivatives), and quinacridone pigment. Organic dyes include acid dyes, direct dyes and dispersing dyes.

When exposure light has a near infrared wavelength, near infrared absorbers includes organic compounds such as cyanine, polymethine, azulenium, squalenium, thiopyrylium, naphthoquinone and anthraquinone dyes, and phthalocyanine, azo and thioamide organic metal complexes. The examples thereof are disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476.

As the colorant, metal atom-containing particles are preferably used in the invention. The metal atom-containing powder includes iron, chromium, manganese, cobalt, nickel, copper, zinc, titanium, silver, aluminum, gold and platinum.

The metal atom-containing particles preferably used include ferromagnetic ferric oxide powder, ferromagnetic metal powder, and cubic, tabular powder, and ferromagnetic metal powder particles are more suitably used.

The metal containing particle content of the image forming layer is 55 to 99 weight %, and preferably 60 to 95 weight %.

The binder resin can be used without limitations, as long as the binder can carry metal containing particles and a colorant absorbing a light of a light source. Typical binders used in the invention are polyurethanes, polyesters, and vinyl chloride type resins such as vinyl chloride copolymers. Preferably, these resins contain repeated units having at least one polar group selected from $-SO_3M$, $-OSO_3M$, $-COOM$ and $-PO(OM_1)_2$, wherein M represents a hydrogen atom or an alkali metal atom and $M_1$ represents a hydrogen atom, an alkali metal atom or an alkyl group. These polar groups have a function to enhance dispersibility of magnetic particles and are contained in the resin at a rate ranging from 0.1 to 8.0 mol %, preferably from 0.5 to 6.0 mol %.

The binders can be used either singly or in combination of two or more kinds; when these are used in combination, the ratio of polyurethane and/or polyester to vinyl chloride type resin is within the range of usually 90:10 to 10:90, preferably 70:30 to 30:70 in weight ratio.

The polar group-containing polyvinyl chloride is prepared by reaction of a hydroxy group containing resin such as vinyl chloride-vinyl alcohol copolymer with a polar group such as $ClCH_2CH_2SO_3M$, $ClCH_2CH_2OSO_3M$, $ClCH_2COOM$ or $ClCH_2P(=O)(OM_1)_2$, or a chlorine atom containing compound.

The polar group containing polyester is prepared by condensation reaction of a polyol with a polybasic acid having a polar group. The polybasic acid having a polar group includes 5-sulfoisophthalic acid, 2-sulfoisophthalic acid, 4-sulfoisophthalic acid, 3-sulfophthalic acid, 5-sulfoisophthalic acid dialkyl, 2-sulfoisophthalic acid dialkyl, 4-sulfoisophthalic acid dialkyl and 3-sulfophthalic acid dialkyl, or a metal salt thereof, and the polyol includes trimethylolpropane, hexane triol, glycerin, trimethylolethane, neopentyl glycol, pentaerythritol, ethylene glycol, propylene glycol, 1,3-butane diol, 1,4-butane diol, 1,3-hexane diol, 1,6-hexane diol, diethylene glycol and cyclohexane dimethanol.

The polar group containing polyurethane is prepared by reaction of a polyol with a polyisocyanate. The polyol includes polyol polyester prepared by reaction of polyol with a polybasic acid having a polar group. The polyisocyanate includes diphenylmethane-4,4-diisocyanate, 2,4-tolylene diisocyanate, 2,6-tolylene diisocyanate, 1,5-naphthalene diisocyanate and lydin isocyanate methylester. The other preparation method of the polar group containing polyurethane includes a reaction of polyurethane having a hydroxy group with a compound containing a polar group and a chlorine atom such as $ClCH_2CH_2SO_3M$, $ClCH_2CH_2OSO_3M$, $ClCH_2COOM$ or $ClCH_2P(=O)(OM_1)_2$.

Besides the above resins, the binder resin includes vinyl chloride resins such as vinyl chloride-vinyl acetate copolymers, polyolefins such as butadien-acrylonitrile copolymers, polyvinyl acetals such as polyvinyl butyrals, cellulose derivatives including nitrocellulose, styrene resins such as styrene-butadiene copolymers, acryl resins such as acrylate resins, polyamide resins, phenolic resins, epoxy resins, and phenoxy resins. The addition amount of these binders is preferably not more than 20 weight % based on the total binder weight.

The binder content of the image forming layer is 1 to 50 weight %, and preferably 5 to 40 weight %.

The image forming layer may contain additives such as lubricants, durability improvers, dispersing agents, antistatic agents, fillers and hardeners, as long as the effects of the invention are not inhibited.

The lubricants include fatty acids, fatty acid esters, fatty acid amides, (modified) silicone oil, (modified) silicone resins, fluorine-containing resins and fluorinated carbons, and the durability improver includes polyisocyanates.

The dispersing agents include fatty acids having 12 to 18 carbon atoms such as lauric acid and stearic acid or their amides, alkali metal salts or alkali earth metal salts, polyalkyleneoxide alkyl phosphates, lecithin, trialkyl polyolefinoxy quaternary ammonium salts and azo compounds having a carboxy group or a sulfon group. The antistatic agents include a cationic surfactant, an anionic surfactant, a nonionic surfactant, a polymeric antistatic agent and conductive fine particles and compounds described on pages 875 and 876, 11290 Chemicals, edited by Kagaku Kogyo Nippo Co. Ltd.

The fillers include inorganic fillers such as carbon black, graphite, $TiO_2$, $BaSO_4$, ZnS, $MgCO_3$, $CaCO_3$, ZnO, CaO, $WS_2$, $MOS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles.

The fillers include inorganic fine particles or organic resin particles, and these fillers can be used as a releasing agent. The inorganic fine particles include silica gel, calcium carbonate, titanium oxide, acid clay, and activated clay, and the organic resin particles include fluorine-containing resin particles, guanamine resin particles, acryl resin particles, and silicone resin particles. The addition amount of the inorganic fine particles or organic resin particles is preferably 0.1 to 70 weight %, although the amount varies depending on their specific gravity.

The hardeners are used without any limitations as long as they can harden the image forming layer, and include, for example, polyisocyanates which are used in preparing polyurethanes for the binder described above. The hardeners harden the image forming layer and give the image having high durability, and stainings at abraded portions can be reduced.

The addition amount of the additives in the image forming layer is 0 to 20 weight %, and preferably 0 to 15 weight %.

The thickness of the image forming layer is 0.05 to 5.0 $\mu$m, and preferably 0.1 to 3.0 $\mu$m. The image forming layer may be a single layer or multiple layers whose compositions may be the same or different. In the multiple layers, the layer closest to a support preferably contains a colorant capable of absorbing light of a light source in a larger amount. The layer farther from a support may contain a colorant capable of absorbing a light having a wavelength longer than the light of a light source.

The image forming layer is formed by kneading a colorant, a binder, and optionally durability improving agents, dispersants, anti-static agents, fillers and hardeners in solvents to obtain a highly concentrated solution, then diluting the solution with the solvents to obtain a coating solution, coating the coating solution on the support and drying.

The solvents include alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone).

The kneaders for an image forming layer composition Suitable examples include two-roll mills, three-roll mills, ball mills, pebble mills, coball mills, Tron mills, sand mills, sand grinders, Sqegvari attritor, high-speed impeller dispersers, high-speed stone mills, high-speed impact mills, dispersers, high-speed mixers, homogenizers, supersonic dispersers, open kneaders, and continuous kneaders.

In order to coat an image forming layer on a support, coating is carried out by an extrusion method. Magnetic particles are optionally oriented or calender treatment may be carried out in order to make uniform the surface of the image forming layer. The magnetic particles are preferably oriented in order to give high resolving power, since the cohesion of the layer can be easily controlled.

A protective layer is preferably provided on the image forming layer. The protective layer contains a resin binder and additives such as fine particles. The resin binder includes polyurethane, polyester, a polyvinyl chloride resin, a vinyl chloride-vinyl acetate copolymer, polyoleffins such as butadiene-acrylonitrile copolymer, polyvinyl acetals such as polyvinyl butyral, polyvinyl acetoacetal, and polyvinyl formal, celluloses such as nitrocellulose, polystyrenes such as styrene-butadiene copolymer, acryl resins such as polymethyl methacrylate, polyamides, phenol resins, epoxy resins, phenoxy resins, and water soluble resins such as polyvinyl alcohol and gelatin. The resin binder may be used singly or in combination of two or more kinds. The resin binder content of the protective layer is 10 to 99.5 weight %, and preferably 40 to 98 weight %. A hardener such as polyisocyanate is preferably added to the protective layer to enhance the layer durability. The resin binder, which is used on hardening the protective layer, is preferably a resin having in the molecule a functional group capable of crosslinking on reaction with the hardener. The preferable resin used when an isocyanate type hardener is used includes phenoxy resins, epoxy resins, celluloses, acetal resins, acryl resins, urethane resins, vinylchloride type resins, and polyesters.

The fine particles include inorganic fillers such as carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles. The fine particles include inorganic fine particles or organic resin particles, and these can be used as a releasing agent. The inorganic fine particles include silica gel, calcium carbonate, titanium oxide, acid clay, and activated clay, and the organic resin particles include fluorine-containing resin particles, guanamine resin particles, acryl resin particles, and silicone resin particles. The addition amount in the protective layer of the inorganic fine particles or organic resin particles is preferably 0.1 to 70 weight %, although the amount varies depending on their specific gravity.

When the image forming material of the invention is exposed to a high density energy light, and the image forming layer at the exposed portions is transferred to the image receiving sheet, the protective layer at the exposed portions is also transferred to the image receiving sheet.

The thickness of the protective layer is usually 0.01 to 1 $\mu$m, and preferably 0.1 to 0.5 $\mu$m.

When another layer is provided on the image forming layer, each layer may be coated separately, and the layers may be multilayer coated by wet-on wet coating method.

In carrying out wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a cast coater or a spray coater can be used. The adhesion between upper and lower layers is enhanced, since in the multilayer coating according to the wet-on-wet method the upper layer is coated on the wet lower layer.

The image receiving sheet in the invention, when an image forming material having the image receiving sheet is exposed to high density energy light, and then the image receiving sheet is peeled from the image forming layer, a sheet capable of receiving the exposed portions of the image forming layer.

The image receiving sheet in the invention may be a self-supporting resin film itself, but is preferably one comprising a substrate and provided thereon, an image receiving layer which is capable of receiving a high density energy light exposed image forming layer.

The substrate for an image receiving sheet includes synthetic paper such as synthetic paper consisting mainly of polypropylene, for example, Yupo produced by Oji Yuka Kako Co., Ltd., Peach Coat series produced by Nissinbo Co., Ltd., and Dianal W-900 produced by Diafoil Hoechst Co., Ltd.

The substrate comprised of a resin in the invention is preferably those oriented in the sheet or film form and heat-set in view of dimensional stability, and may have microvoids or no voids. For example, Dianal W-410 produced by Diafoil Hoechst Co., Ltd. is preferably used.

Another substrate includes a resin film such as polyacrylate, polymethacrylate, polyethyleneterephthalate, polybutyleneterephthalate, polyethylenenaphthalate, polycarbonate, polyvinyl chloride, polyethylene, polypropylene, polystyrene, nylon, aromatic polyamide, polyether etherketone, polysulfone, polyether sulfone, polyimide or polyether imide, or a film in which the above two or more resin films are laminated.

Another paper substrate used in the image receiving sheet in the invention is preferably a pulp paper papered from natural pulp, synthetic pulp, or a mixture thereof, and more preferably paper papered from a tree pulp. Paper is papered through a long wire papering machine, and after the papering, calendering is preferably carried out using a machine calender, super calender or heat calender for improving smoothness. In order to improve smoothness, a paper coated with a resin layer containing pigment is suitably used. The example of the paper support includes a wood free paper, art paper, coat paper, impregnate paper and paper board.

Since the image receiving sheet after image forming is unnecessary, the thickness should be as small as possible in view of waste reduction. However, the too thin image receiving sheet is likely to be broken when it is peeled from the imaging sheet of the image forming material, and is difficult to transport after the peeling. The thickness of the image receiving sheet substrate is ordinarily 5 to 100 µm, and preferably 10 to 50 µm.

In the image receiving sheet in the invention, an image receiving layer, which can receive an image forming layer to be transferred after high density energy light exposure, is preferably provided on the side contacting the imaging sheet.

The image receiving layer is comprised mainly of a thermoplastic resin binder. As the thermoplastic resin binder is preferably used a urethane resin, an acryl resin or a styrene copolymer elastomer.

The urethane resin includes a resin having a urethane bond (—NHCOO—) in its molecule, and typically a polyurethane resin for adhesive, Nippolane made by Nihon Polyurethane Kogyo Co. Ltd. The acryl resin includes an ethylene-ethylacrylate copolymer resin (EEA), an ethyleneacrylic acid copolymer resin (EAA), and modified acryl resins, and typically, EVAFLEX-EEA made by Mitsui Dupont Chemical Co. Ltd., and Nipol LX series made by Nihon Zeon Co. Ltd.

As the styrene copolymer elastomer are preferably used block copolymers SPS, SIS, SEBS and SEPS having, in the molecules, polystyrene block (S) copolymerized with polybutadiene block (B), polyisoprene block (I), polyethylene/butylene block (EB), or polyethylene/propylene block (EP). Typically, the styrene copolymer elastomer includes Cariflex TR, Kraiton D or Kraiton G made by Shell Japan Co., Ltd., Septon or Hiblar made by Kurary Co., Ltd., Tufftec H or M series made by Asahi Kasei Co., Ltd.

Another resin can be used in combination, as long as the effect of invention is not inhibited.

The inorganic or organic fillers can be added to the image receiving layer in order to control the smooster value.

Lamination of the imaging sheet with the image receiving sheet is carried out by applying pressure and/or heat under a temperature higher than room temperature. The pressure or heat-pressure applying can be carried out without any limitations so long as the pressure or heat-pressure can be applied air-tightly. The pressure is applied by means of a pressure roller or a stamper, and the heat-pressure is applied by means of a thermal head, a heat roller or a hot stamp.

When the pressure roller is employed, the pressure is usually 0.1 to 20 kg/cm, and preferably 0.5 to 10 kg/cm and the transport speed is usually 0.1 to 200 mm/sec., and preferably 0.5 to 100 mm/sec. When the stamper is employed, the pressure is usually 0.05 to 10 kg/cm, and preferably 0.5 to 5 kg/cm and the pressure time is usually 0.1 to 50 seconds, and preferably 0.5 to 20 seconds. The thermal head is used under conditions usually applied in the conventional fusible or sublimation transfer process. When the heat roller is employed, the heat temperature is usually 50 to 200° C., and preferably 80 to 180° C., the pressure is usually 0.1 to 20 kg/cm, and preferably 0.5 to 10 kg/cm and the transport speed is usually 0.1 to 200 mm/sec., and preferably 0.5 to 100 mm/sec. When the hot stamper is employed, the heat temperature is usually 60 to 200° C., and preferably 80 to 150° C., the pressure is usually 0.05 to 10 kg/cm, and preferably 0.5 to 5 kg/cm and the pressure time is usually 0.1 to 50 seconds, and preferably 0.5 to 20 seconds.

As a first embodiment of the image forming material of the invention, both surfaces of the image receiving sheet have an average surface roughness Ra of 0.05 to 0.4 µm. In the image forming material of the invention, both surfaces of the image receiving sheet before laminated on the imaging sheet have an average surface roughness Ra of 0.05 to 0.4 µm. The average surface roughness Ra herein referred to is determined by ANSI D-46.1 (1985).

As a method of obtaining the surface roughness within the above range, there is a method of surface-roughening the substrate or providing a resin binder layer containing inorganic or organic fine particles on the substrate. The resin binder layer can also function as an image receiving layer. The binder used in the resin binder layer includes those as described above in the image receiving layer.

The examples of the substrate having a surface roughness Ra of 0.05 to 0.4 µm include W-400 (Ra=0.16), E-150 (Ra=0.25), and E-130 (Ra=0.34), each produced by Diafoil Hoechst Co., Ltd. As a method of adjusting the surface roughness of the substrate, there is a method of surface-roughening the substrate by incorporating voids, or inorganic or organic fine particles in the substrate.

The inorganic fine particles include metal oxides such as silica, titanium oxide, aluminum oxide, zinc oxide, magnesium oxide and aluminum borate, metal salts such as calcium carbonate, magnesium carbonate, barium sulfate, magnesium sulfate, aluminum hydroxide, magnesium hydroxide and boron nitride, caorin, clay, talc, zinc white, white lead, zieklite, quartz, kieselguhr, pearlite, bentonite, mica and synthetic mica.

The organic fine particles include melamine resin particles, guanamine resin particles, styrene-acryl copolymer resin particles, silicone resin particles and fluorine containing resin particles.

Of these organic fine particles, hollow resin particles are preferable in that sensitivity and density are enhanced. The hollow particles include hollow cross-linked styrene-acryl resin particles. The content in the resin binder layer of the organic or in organic fine particles is usually 0.1 to 30 weight %, and preferably 1 to 20 weight %. The average particle size of the fine particles is usually 0.01 to 2 µm, and preferably 0.02 to 1 µm.

The resin binder layer may contain additives such as an anti-static agent, a thermally stabilizing agent, an antioxidant, a ultraviolet light absorber, a light resistant agent and a brightening agent, besides the fine particles.

The content in the resin binder layer of the additives is usually 30 weight % or less, and preferably 20 weight % or less.

In a second embodiment of the image forming material of the invention, the surface of the support opposite the image forming layer and the surface of the image receiving sheet opposite the image forming layer both have a smooster value of 5 to 100 mmHg.

As a method of obtaining both surfaces having a smooster value within the above range, there is a method of surface-roughening the substrate or providing a resin binder layer containing inorganic or organic fine particles on the substrate.

The content in the resin binder layer of the organic or inorganic fine particles is usually 0.1 to 200 weight %, and preferably 1 to 100 weight %. The thickness of the resin binder layer is usually 0.01 to 10 μm, and preferably 0.1 to 5 μm.

<Image forming method>

When the image forming material of the invention is exposed to a high density energy light, adhesion force at the exposed portions between the image receiving sheet and the image forming layer is not varied, and adhesion force at the exposed portions between the support and the image forming layer is reduced. After the exposure, the image receiving sheet is peeled from the image forming layer, and the image forming layer at the exposed portions is transferred to the image receiving sheet to form an image.

In order to obtain a high resolving power, the light source is preferably an electromagnetic wave capable of making the energy spots smaller, particularly, a UV light having 1 nm to 1 mm wavelength, a visible light or an infrared light. Such a high density energy light includes, for example, a laser light, an emission diode, a xenon flush lamp, a halogen lamp, a carbon arc light, a metal halide lamp, a tungsten lamp, a quarts mercury lamp and a high pressure mercury lamp. The energy applied is optionally adjusted by selecting an exposure distance, an exposure time or an exposure strength according to kinds of image forming materials used.

When an entire exposure is carried out using the high density energy light, the exposure is carried out through a mask material having a negative pattern made of a light shielding material.

When an array light such as an emission diode array is used or exposure using a halogen lamp, a metal halide lamp or a tungsten lamp is controlled using an optical shutter material such as liquid crystal or PLZT, a digital exposure according to an image signal is possible, and direct writing is possible without using the mask material. However, this method requires additional optical shutter beside the light source. Therefore, the digital exposure is preferably carried out using a laser light.

When the laser light is used, the light can be condensed in the beam form and a latent image is formed using a scanning exposure according to an image. The laser light is easy to condense the exposure spots in small size and therefore, a highly dissolved image can be obtained.

The laser light used in the invention is well known. The laser source includes solid lasers such as a ruby laser, a YAG laser, a glass laser, a gas laser such as a He—Ne laser, a Ar laser, a Kr laser, a $Co_2$ laser, a Co laser, a He—Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a laser having a 600 to 1200 nm wavelength is preferable in sensitivity in order to produce effectively abrasion, since a light energy can be effectively converted to a heat energy.

The high density light exposure is preferably carried out from the support side.

Various peeling methods can be employed as long as they have no adverse affect on image forming. The peeling method includes a method of peeling the adhesion sheet from the image forming material using a peeling plate or a peeling roller with a fixed peeling angle and a method of manually peeling the image receiving sheet from the image forming material without fixing a peeling angle.

The image forming material having a single image forming layer on a support was described above. When an intermediate layer is provided between an image forming layer and a support, abrasion may be caused between the support and the intermediate layer or between the image forming layer and the intermediate layer, or the intermediate layer may be partly destroyed.

The thickness of the image receiving sheet is preferably 5 to 300 μm, and more preferably 10 to 100 μm.

The image forming material preferably comprises an anti-static layer in order to minimize static produced in the transporting or peeling steps in an image forming apparatus.

The anti-static layer is provided to give a surface resistance of $10^{11}$ $\Omega/m^2$ or less according to an ASTM D257 method. The anti-static layer of this surface resistance can be obtained by coating a coating solution containing an anti-static agent or conductive fine particles on a support or by incorporating them in a resin constituting the support.

The anti-static layer is preferably provided on the side of the image receiving sheet opposite the image forming layer, whereby transportability can be improved without affecting an image quality. The anti-static agent includes a cationic surfactant such as a quaternary ammonium salt or polyamine derivative, an anionic surfactant such as an alkylsulfonate, an amphoteric betaine type surfactant, a nonionic surfactant such as a fatty acid ester, and polysiloxanes. The amphoteric or cationic water-soluble acryl resin can form an anti-static layer alone without using a binder.

The anti-static agent is dissolved or dispersed in an organic solution containing a binder. The binder is not limited, as long as it is miscible with or dispersed in the anti-static agent or conductive fine particles, and has adhesion with the support. The binder includes resins such as polyesters, polyvinyl chlorides, polyvinylbutyrals, polyacrylates, polyurethanes, celluloses, aromatic polyamides, silicone resins, epoxy resins, phenol resins, melamine resins, fluorine-containing resins, polyimides, acryl resins, urethane-modified silicone resins, polyethylenes or polypropylenes.

The conductive fine particles may be any, as long as they have a conductive property, and includes metal oxide fine particles forming an indefinite element ratio compound such as oxygen-deficient oxides, metal-excessive oxides, metal-deficient oxides, or oxygen-excessive oxides. The most preferable compounds are metal oxide fine particles prepared by various methods such as a synthetic method. The examples include crystalline metal oxide fine particles such as $ZnO$, $TiO_2$, $SnO_2$, $Al_2O_3$, $In_2O_3$, $SiO_2$, $MgO$, $B_2O$, $MoO_3$ or their complex oxides. Of these, $ZnO$, $TiO_2$, and $SnO_2$ is preferable, and as the complex oxides are preferable $ZnO$ containing a different element Al or In, $TiO_2$ containing a different element Nb or Ta, $SnO_2$ containing a different element Sb, Nb or a halogen atom, each containing the different element in an amount of 0.01 to 30 mol %, and preferably 0.1 to 10 mol %. The volume resistance of the conductive fine particles is preferably not more than $10^7$ $\Omega/cm$, and more preferably not more than $10^5$ $\Omega/cm$. The particles having oxygen deficiency in the crystals or the metal oxides containing a small amount of a different atom as a doner are preferable in improved conductivity. The synthetic method of the conductive fine particles is detailed in, for example, Japanese Patent O.P.I. Publication No. 56-143430.

The binder of the conductive fine particles in the anti-static layer includes proteins such as gelatin, gelatin derivatives, colloidal alubmin, or casein; cellulose compounds such as carboxymethyl cellulose, hydroxyethyl cellulose, diacetyl cellulose or triacetyl cellulose; saccharide derivatives such as agar, sodium alginate or starch derivatives; synthetic hydrophilic colloids such as polyvinyl alcohol, poly-N-vinyl pyrrolidone, acrilyc acid copolymers or polyacrylamide or their derivatives; vinyl polymers or copolymers such as polyvinyl acetate, polyacrylonitrile or polyacrylates; natural resins such as rosin, shellac or their derivatives; and other synthetic resins. The emulsion of styrene-butadiene copolymer, polyacrylic acid, polyacrylates or its derivatives, polyvinyl acetate, vinyl acetate-acrylate copolymers, polyolefins, olefin-vinyl acetate copolymers can be also used. Besides the above binders, the resins such as polycarbonate, polyester, urethane or epoxy type resins, polyvinyl chloride, polyvinylidene chloride or poly pyrrole can be used. Two or more kinds of these binder resins can be used in admixture.

Of these binders, acrylic acid copolymers, polyacrylamides, polyacrylonitrile, polyacrylates, polycarbonates, polyesters, polyvinyl chlorides or polyvinylidene chlorides are preferable in view of handling or performance of products.

In order to improve adhesion between the anti-static layer and the substrate, the anti-static layer can contain a compound capable of swelling the substrate. This compound includes resorcine, chlororesorcine, methylresorcine, o-, m-, or p-cresol, phenol, o-, or p-chlorophenol, dichlorophenol, trichlorophenol, monochloroacetic acid, dichloroacetic acid, trichloroacetic acid, trifluoroacetic acid, and chloral hydrate. Resorcine and p-chlorophenol are especially preferable.

The conductive fine particle content of the anti-static layer is preferably 10 to 70% by volume, and more preferably 15 to 50% by volume, and preferably 0.01 to 5.0 g/m$^2$, more preferably 0.1 to 2.0 g/m$^2$. The content of the compound capable of swelling the support is preferably 0.01 to 5.0 g/m$^2$, more preferably 0.05 to 1.0 g/m$^2$.

The anti-static layer coating solution is prepared by dispersing the above composition in an appropriate solvent. One having ordinary skill in the art can easily select a suitable solvent. The coating method includes a conventional method such as blade coating, roll coating, bar coating, curtain coating, gravure coating, extrusion lamination coating, or lamination coating. The coating solution may optionally contain a coating auxiliar y such as saponin or dodecylbenzenesulfonic acid, a hardener, a colorant, a UV absorbent, or a heat reflecting agent.

A subbing layer can be provided between the substrate and the anti-static layer in order to increase adhesion between them.

The surface specific resistance of the anti-static layer can be adjusted 10$^{11}$ Ω/m$^2$ or less by controlling the conductive fine particle content by volume of the anti-static layer or the anti-static layer thickness. The binder content of the anti-static layer is preferably not less than 5% by weight in view of a sufficient layer strength.

The anti-static agent content of the anti-static layer is preferably 0.5 to 30% by weight, and more preferably 1 to 10% by weight, and preferably 0.001 to 1 g/m$^2$, more preferably 0.002 to 0.05 g/m$^2$. The conductive fine particle content of the anti-static layer is preferably 10 to 70% by volume, and more preferably 15 to 50% by volume, and preferably 0.01 to 5.0 g/m$^2$, more preferably 0.1 to 2 g/m$^2$.

The anti-static layer can optionally contain a coating improver such as a surfactant. In order to enhance adhesion between the support and the anti-static layer, an intermediate layer can be provided between them, the anti-static layer can contain an adhesive or the anti-static layer can be hardened, as long as the effect of the invention is not inhibited.

EXAMPLES

The invention is hereunder described with examples, but the scope of the invention is by no means limited to them. In the examples, all "parts" are parts by weight, unless otherwise specified.

Example 1

<Image forming material>

The inventive image forming material and comparative image forming material were prepared using an imaging sheet (a support, an image forming layer, an image protective layer), and an image receiving sheet as shown below.

Imaging Sheet (Support)

One hundred μm thick transparent polyethylene terephthalate film subjected to corona discharge on the image forming layer side surface (T-100E: produced by Diafoil Hoechst Co., Ltd.)

(Image forming layer)

The following composition was kneaded and dispersed with an open kneader to obtain an image forming layer coating solution containing magnetic particles. The resulting coating solution was coated on the support, subjected to magnetic orientation before drying, dried, subjected to calender treatment, and heated at 60° C. for 72 hours for hardening to give an image forming layer having a dry thickness of 1.2 μm.

| | |
|---|---|
| Fe—Al ferromagnetic metal powder, (as colorant or metal containing powder, Fe:Al ratio in number of atoms:overall average = 100:4, surface layer = 50:50, average major axial length = 0.14 μm) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Stearic acid | 1 part |
| Butyl stearate | 1 part |
| Polyisocyanate (Coronate L made by Nihon Polyurethane Kogyo Co., Ltd.) | 5 parts |
| Cyclohexanone | 100 parts |
| Methyl ethyl ketone (MEK) | 100 parts |
| Toluene | 100 parts |

(Image protective layer)

The following composition containing a resin and fine particles was provided on the above obtained image forming layer by a wire bar coating method to give a coating amount of 0.1 g/m$^2$. Thus, an imaging sheet was obtained.

| | |
|---|---|
| Phenoxy resin (PKHH made by Union Carbide Co., Ltd.) | 7 parts |
| Polyisocyanate Colonate L | 2.5 parts |
| Silicone resin fine particles (Average particle diameter: 2.0 μm) (Tospar 120 produced by Toshiba Silicone Co., Ltd.) | 0.5 parts |
| Methyl ethyl ketone | 90 parts |

Image Receiving Sheet

Polyurethane resin Nippolane 3116 (made by Nihon Polyurethane Kogyo Co., Ltd.) was dissolved in a mixture solvent of toluene and MEK (1/1) to give a 10% solid concentration. The following two fine particles having a different average particle size were added in a mixture ratio of 0:100 to 100:0 in an amount of 0 to 20 weight % based on the total solid content to the resulting solution and dispersed by a supersonic wave method. The resulting dispersion was coated on one surface of the following substrate by a wire-bar method, and dried. Thus, an image receiving layer was formed so that Ra of the surface (obverse surface) on the image forming layer side was varied as shown in Table 1.

Polyester resin Vylon 200 (made by Toyobo Co., Ltd.) was dissolved in a mixture solvent of toluene and MEK (1/1) to give a 10% solid concentration. The following two fine particles having a different average particle size were added in a mixture ratio of 0:100 to 100:0 in an amount of 0 to 20 weight % based on the total solid content to the resulting solution and dispersed by a supersonic wave method. The resulting dispersion was coated on the surface of the substrate opposite the above polyurethane resin layer by a wire-bar, and dried so that Ra of the surface (reverse surface) of the polyester resin layer was varied as shown in Table 1. Thus, image receiving sheets as shown in Table 1 were obtained.

| -Substrate- |
| --- |
| T-100 E for Sample No. 1 |
| T-100 E for Sample No. 2 |
| W-400 for Sample No. 3 |
| E-150 for Sample No. 4 |
| E-130 for Sample No. 5 |
| T-100E for Sample No. 6 |
| T-100E for Sample No. 7 |
| T-100E for Sample No. 8 |
| T-100E for Sample No. 9 |
| T-100E for Sample No. 10 |
| T-100E for Sample No. 11 |
| T-100E for Sample No. 12 |

The above substrates are PET films made by Diafoil Hoechst Co., Ltd.

Fine particles Tospar 108 (Average particle size: 0.8 μm) Tospar 145 (Average particle size: 4.5 μm) The above particles are silicone resin fine particles made by Toshiba Silicone Co., Ltd.

(Lamination of imaging sheet and image receiving sheet)

The image receiving sheet was laminated on the imaging sheet not to form voids so that the image receiving layer contacted the protective layer of the imaging sheet using pressure rollers (transporting speed: 30 mm/second, Pressure: 4.0 kg/cm, Temperature: 85° C.). Thus, image forming material sample Nos. 1 through 12 were obtained.

The resulting samples were evaluated according to the following methods.

(Measurement of Smooster Values)

The smooster value was measured by a smooster SM-6B produced by Toei Denkikogyo Co., Ltd. The smooster is a vacuum type air macrometer, which measures pressure (mmHg) of air sucked by the measuring head contacting the surface to be measured.

(Measurement of Average Surface Roughness)

The average surface roughness (Ra) of the image receiving sheet was determined according to ANSI (D-46.1 (1985).

<Image forming method>

As is illustrated in FIG. 1, the image forming material 1 in a cartridge 2 was transported through transporting rollers 3 to fix on a drum 4 under reduced pressure and imagewise scanning exposed from the support side, focused on the surface of the image forming layer using a simiconductor laser 6 (LT090MD, main wavelength:830 nm, produced by Sharp Co., Ltd.), whereby adhesion between the image forming layer and the support was reduced at exposed portions. Thereafter, the resulting material was transported through transporting rollers 8 to a peeling bar 10, and the image receiving sheet 13 was peeled from the imaging sheet 15. The imaging sheet 15 having an image was fed into an accomodating box 14, and the image receiving sheet 13 was discharged into a discharging box 12. Symbol 7 shows laser light.

Transportability of image forming material before and after exposure, exposure energy necessary to form an image, staining at exposed portions (optical density) and resolving power of the formed image were evaluated according to the following criteria:

(Sensitivity)

The average exposure amount (E, mJ/cm$^2$) on the image forming layer surface was measured which was necessary to form a solid image of 0.5 mm×0.5 mm by scanning-exposing with a light having a 10 μm beam diameter. Sensitivity was evaluated according to the following four stages:

A: $E \leq 250$

B: $250 < E \leq 400$

C: $400 < E \leq 800$

D: $600 < E$ (Resolving Power)

A: Ten μm lines can be formed.

B: Twenty μm lines can be formed.

C: Thirty and forty μm lines can be formed.

D: Forty μm lines or less can not be formed.

(Optical Density)

Visible light optical density at exposed portions of the imaging sheet after peeling was measured using a densitometer X-rite (produced by X-rite Co., Ltd.).

A: OD not more than 0.03 (excellent)

B: OD of 0.04 to 0.05 (no practical problem)

C: OD of 0.04 to 0.05 (unevenness was observed with a magnifier)

D: OD not less than 0.1 (unevenness was visually observed)

(Transportability)

While 1000 sheets of the image forming materials were transported in an image forming apparatus, jamming frequency before and after exposure was counted.

A: Three sheets or less

B: Four to ten sheets

C: Eleven to thirty sheets

D: Thirty-one or more sheets

The results are shown in Table 1.

TABLE 1

| Sample No. | Obverse Surface Ra (μm) | Reverse Surface Ra (μm) | Transportability* Before Exposure | Transportability* After Exposure | Sensitivity | Optical Density | Resolving Power |
|---|---|---|---|---|---|---|---|
| 1 (Comp.) | 0.04 | 0.04 | D | D | D | D | D |
| 2 (Inv.) | 0.05 | 0.05 | B | B | C | B | C |
| 3 (Inv.) | 0.16 | 0.16 | A | A | A | A | A |
| 4 (Inv.) | 0.25 | 0.25 | A | A | A | A | A |
| 5 (Inv.) | 0.34 | 0.34 | B | A | A | A | B |
| 6 (Comp.) | 0.50 | 0.50 | C | B | C | B | C |
| 7 (Inv.) | 0.16 | 0.25 | A | A | B | A | B |
| 8 (Comp.) | 0.16 | 0.04 | D | D | A | A | A |
| 9 (Comp.) | 0.04 | 0.16 | C | D | B | B | C |
| 10 (Inv.) | 0.16 | 0.16 | A | A | A | B | B |
| 11 (Comp.) | 0.16 | 0.50 | A | B | C | C | C |
| 12 (Comp.) | 0.50 | 0.16 | C | B | C | C | C |

*Transportability of image forming materials before exposure was evaluated, and transportability of image receiving sheets after exposure was evaluated.
Comp.: Comparative, Inv.: Invention.

Example 2
<Image forming material>

The image forming material Sample Nos. 13 through 27 comprising a support/image forming layer/image protective layer/image receiving sheet were prepared in the same manner as in sample No. 3 of Example 1, except that smooster values of the support (PET film W-400) and the image receiving sheet were varied as shown in Table 2. The smooster values were varied in a similar manner as the method of Example 1 by which Ra was varied. The resulting materials were evaluated in the same manner as in Example 1. The results are shown in Table 2.

TABLE 2

| Sample No. | Smooster Value (mmHg) *Support | Smooster Value (mmHg) **Image Receiving Sheet | Transport ability (before Exposure) | Sensitivity | Optical Density | Resolving Power |
|---|---|---|---|---|---|---|
| 13 (Comp.) | 1 | 24 | D | A | D | B |
| 14 (Comp.) | 4 | 24 | D | A | C | B |
| 15 (Inv.) | 5 | 24 | B | A | B | A |
| 16 (Inv.) | 19 | 24 | A | A | A | A |
| 17 (Inv.) | 37 | 24 | A | A | A | A |
| 18 (Inv.) | 52 | 24 | A | A | A | A |
| 19 (Inv.) | 84 | 24 | A | A | A | B |
| 20 (Inv.) | 98 | 24 | B | A | B | B |
| 21 (Comp.) | 125 | 24 | C | A | D | D |
| 22 (Comp.) | 21 | 3 | D | D | D | A |
| 23 (Inv.) | 21 | 6 | B | B | B | A |
| 24 (Inv.) | 21 | 21 | A | A | A | A |
| 25 (Inv.) | 21 | 50 | A | A | A | A |
| 26 (Inv.) | 21 | 96 | A | B | B | A |
| 27 (Comp.) | 21 | 119 | C | C | D | A |

Comp.: Comparative, Inv.: Invention
*The surface of the support opposite the image forming layer was measured.
**The surface of the image receiving sheet opposite the image forming layer was measured.

Example 3

Image forming material sample Nos. 28 through 31 were prepared in the same manner as in Sample No. 5 of Example 1, except that 10 mg/m² of the anti-static agent were added as follows:

Sample No. 28: not added to any layer
Sample No. 29: added to the protective layer
Sample No. 30: added to the layer of the support of the image receiving sheet opposite the surface contacting the protective layer
Sample No. 31: added to the layer contacting the protective layer of the image receiving sheet The resulting image forming materials were allowed to stand for 3 days, and then image formed and evaluated in the same manner as in Example 1.

| | |
|---|---|
| Polyester resin Vylon 200 (made by Toyobo Co., Ltd.) | 8.5 parts |

-continued

| Silicone resin fine particles Tospar 120 (made by Toshiba Silicone Co., Ltd) | 0.5 parts |
| --- | --- |
| Anti-static agent Arcard C (made by Lion Co., Ltd) | 1 part |
| Methylethyl ketone | 70 parts |
| Cyclohexanone | 20 parts |

(Image Defects)

Scanning-exposing was carried out to form a solid image of 10 mm×10 mm with light having a 10 μm beam diameter, and image defects in the solid image were counted according to the following four stages.

A: Two defects or less
B: Three to seven defects
C: Eight to forty-nine defects
D: Fifty defects or more

TABLE 3

| Sample No. | Image Defects | Optical Density | Resolving Power |
| --- | --- | --- | --- |
| 28 (Inv.) | C | A | B |
| 29 (Inv.) | A | A | B |
| 30 (Inv.) | A | A | A |
| 31 (Inv.) | A | A | A |

Inv.: Invention

What is claimed is:

1. An image forming material comprising an imaging sheet; and an image receiving sheet, the image receiving sheet having two surfaces and being laminated on the imaging sheet, the imaging sheet comprising a support and provided thereon, an image forming layer contacting the image receiving sheet, an image being formed by exposing the material to a high density energy light to reduce adhesion between the image forming layer and the support at exposed portions without substantially changing adhesion between the image forming layer and the image receiving sheet and peeling the image receiving sheet from the image forming layer to transfer the image forming layer at exposed portions to the image receiving sheet; wherein both surfaces of the image receiving sheet have an average surface roughness Ra of 0.05 to 0.4 μm.

2. The image forming material of claim 1, wherein the surface on the side of the support opposite the image forming layer and the surface of the image receiving sheet opposite the image forming layer both have a smooster value of 5 to 100 mmHg in an atmosphere of 23° C. and 55% RH.

3. The image forming material of claim 1, wherein the image forming layer contains a colorant in an amount of 50 to 99 weight % and a binder in an amount of 1 to 50 weight %.

4. The image forming material of claim 3, wherein the colorant is metal atom-containing particles.

5. The image forming material of claim 4, wherein the metal atom-containing particles are ferromagnetic metal particles.

6. The image forming material of claim 3, wherein the binder is selected from the group consisting of polyurethanes, polyesters, and vinyl chloride type resins, each containing repeated units having at least one polar group of —$SO_3M$, —$OSO_3M$, —COOM and —$PO(OM_1)_2$, in which M represents a hydrogen atom or an alkali metal atom and $M_1$ represents a hydrogen atom, an alkali metal atom or an alkyl group.

7. The image forming material of claim 1, wherein the image receiving sheet comprises a substrate and provided thereon, an image receiving layer on the image forming layer side and a resin binder layer on the side of the substrate opposite the image forming layer, wherein the image receiving layer and the resin binder layer both contain inorganic or organic fine particles.

8. The image forming material of claim 1, wherein the image receiving sheet comprises an anti-static layer.

9. The image forming material of claim 6 wherein the vinyl chloride type resins are vinyl chloride copolymers.

10. The image forming material of claim 6, wherein the colorant is ferromagnetic metal particles.

\* \* \* \* \*